(12) United States Patent
Paulson et al.

(10) Patent No.: US 8,697,980 B2
(45) Date of Patent: Apr. 15, 2014

(54) PHOTOVOLTAIC MODULE UTILIZING AN INTEGRATED FLEX CIRCUIT AND INCORPORATING A BYPASS DIODE

(75) Inventors: Puthur Paulson, Cupertino, CA (US); William Sanders, Mountain View, CA (US); Ben Tarbell, Palo Alto, CA (US)

(73) Assignee: Hanergy Holding Group Ltd., Beijing (CN)

( * ) Notice: Subject to any disclaimer, the term of this patent is extended or adjusted under 35 U.S.C. 154(b) by 1647 days.

(21) Appl. No.: 11/812,515

(22) Filed: Jun. 19, 2007

(65) Prior Publication Data

US 2008/0314432 A1    Dec. 25, 2008

(51) Int. Cl.
*H01L 31/05* (2006.01)

(52) U.S. Cl.
USPC .......... 136/244; 136/256; 136/255; 136/293; 136/252

(58) Field of Classification Search
USPC .......................... 136/244, 256, 255, 293, 252
See application file for complete search history.

(56) References Cited

U.S. PATENT DOCUMENTS

| | | | |
|---|---|---|---|
| 3,553,030 A | | 1/1971 | Lebrun |
| 4,577,051 A | * | 3/1986 | Hartman ........................ 136/244 |
| 4,609,770 A | * | 9/1986 | Nishiura et al. ............... 136/244 |
| 4,652,693 A | * | 3/1987 | Bar-On .......................... 136/251 |
| 4,665,277 A | * | 5/1987 | Sah et al. ....................... 136/255 |
| 4,694,117 A | | 9/1987 | Friedrich et al. |
| 4,746,618 A | * | 5/1988 | Nath et al. ....................... 438/62 |
| 5,330,583 A | | 7/1994 | Asai et al. |
| 5,389,159 A | | 2/1995 | Kataoka et al. |
| 5,391,235 A | * | 2/1995 | Inoue ............................. 136/244 |
| 5,457,057 A | | 10/1995 | Nath et al. |
| 5,474,621 A | | 12/1995 | Barnard |
| 5,620,528 A | | 4/1997 | Schade et al. |
| 5,626,688 A | | 5/1997 | Probst et al. |
| 5,814,195 A | | 9/1998 | Lehan et al. |
| 5,990,415 A | | 11/1999 | Green et al. |
| 6,013,870 A | * | 1/2000 | Psyk et al. ..................... 136/249 |
| 6,020,555 A | * | 2/2000 | Garboushian et al. ........ 136/256 |

(Continued)

FOREIGN PATENT DOCUMENTS

| | | |
|---|---|---|
| DE | 2757301 A1 | 7/1979 |
| JP | 2007302923 | 11/1995 |

(Continued)

OTHER PUBLICATIONS

International Search Report from counterpart PCT/US2008/007531, dated Dec. 31, 2008, 2 pages.

(Continued)

*Primary Examiner* — Golam Mowla
(74) *Attorney, Agent, or Firm* — The Marbury Law Group PLLC

(57) ABSTRACT

One photovoltaic module has a plurality of photovoltaic cells including a first photovoltaic cell and a second photovoltaic cell, a collector-connector configured to collect a current from the first photovoltaic cell and electrically connect the first photovoltaic cell to the second photovoltaic cell and at least one diode configured to bypass at least one of the photovoltaic cells. Another photovoltaic module has a plurality of cells including a first photovoltaic cell and a second photovoltaic cell, such that the first photovoltaic cell contains an active portion and a shaded portion, that is configured as a diode bypassing the second photovoltaic cell. Methods of making photovoltaic modules that incorporate bypass diodes are also provided.

11 Claims, 11 Drawing Sheets

(56) References Cited

U.S. PATENT DOCUMENTS

| | | | |
|---|---|---|---|
| 6,103,970 A * | 8/2000 | Kilmer et al. | 136/252 |
| 6,114,046 A | 9/2000 | Hanoka | |
| 6,121,542 A | 9/2000 | Shiotsuka et al. | |
| 6,218,606 B1 | 4/2001 | Morizane | |
| 6,231,732 B1 | 5/2001 | Hollars et al. | |
| 6,248,948 B1 * | 6/2001 | Nakagawa et al. | 136/244 |
| 6,274,804 B1 | 8/2001 | Psyk et al. | |
| 6,326,540 B1 * | 12/2001 | Kilmer et al. | 136/252 |
| 6,359,210 B2 * | 3/2002 | Ho et al. | 136/256 |
| 6,365,010 B1 | 4/2002 | Hollars | |
| 6,372,538 B1 | 4/2002 | Wendt et al. | |
| 6,384,313 B2 * | 5/2002 | Nakagawa et al. | 136/244 |
| 6,479,744 B1 | 11/2002 | Tsuzuki et al. | |
| 6,488,824 B1 | 12/2002 | Hollars et al. | |
| 6,545,211 B1 * | 4/2003 | Mimura | 136/244 |
| 6,600,100 B2 | 7/2003 | Ho et al. | |
| 6,617,508 B2 * | 9/2003 | Kilmer et al. | 136/252 |
| 6,690,041 B2 * | 2/2004 | Armstrong et al. | 257/184 |
| 6,974,976 B2 | 12/2005 | Hollars | |
| 6,979,771 B2 * | 12/2005 | Mimura | 136/244 |
| 7,082,019 B2 * | 7/2006 | Bodeau et al. | 361/82 |
| 7,605,498 B2 * | 10/2009 | Ledenev et al. | 307/80 |
| 2004/0069340 A1 | 4/2004 | Luch | |
| 2005/0072461 A1 | 4/2005 | Kuchinski et al. | |
| 2005/0109392 A1 | 5/2005 | Hollars | |
| 2005/0133083 A1 | 6/2005 | Matsushita et al. | |
| 2005/0176270 A1 | 8/2005 | Luch | |
| 2005/0241692 A1 | 11/2005 | Rubin et al. | |
| 2006/0032752 A1 | 2/2006 | Luch | |
| 2006/0180195 A1 | 8/2006 | Luch | |
| 2007/0181175 A1 * | 8/2007 | Landis | 136/252 |
| 2007/0283996 A1 * | 12/2007 | Hachtmann et al. | 136/244 |
| 2007/0283997 A1 * | 12/2007 | Hachtmann et al. | 136/244 |
| 2008/0142071 A1 * | 6/2008 | Dorn et al. | 136/245 |
| 2008/0314432 A1 * | 12/2008 | Paulson et al. | 136/244 |
| 2009/0014049 A1 * | 1/2009 | Gur et al. | 136/244 |
| 2009/0014057 A1 * | 1/2009 | Croft et al. | 136/248 |
| 2009/0014058 A1 * | 1/2009 | Croft et al. | 136/248 |
| 2009/0283137 A1 | 11/2009 | Croft et al. | |
| 2010/0018135 A1 * | 1/2010 | Croft et al. | 52/173.3 |
| 2010/0108122 A1 | 5/2010 | Everson et al. | |
| 2011/0121441 A1 | 5/2011 | Halstead et al. | |
| 2011/0146778 A1 | 6/2011 | Croft et al. | |

FOREIGN PATENT DOCUMENTS

| | | |
|---|---|---|
| JP | 2000216421 | 8/2000 |
| JP | 2000-269531 A | 9/2000 |
| JP | 2000277785 | 10/2000 |
| JP | 2001298134 | 10/2001 |
| JP | 2002158324 | 5/2002 |

OTHER PUBLICATIONS

Richards et al., "Enhancing the efficiency of production CdS/CdTe PV modules by overcoming poor spectral response at short wavelengths via luminescence down-shifting," 2006 IEEE 4$^{th}$ World Conference on Photovoltaic Energy Conversion, May 7-12, 2006, 4 pages.

Untila et al., "19.2% Efficient Bifacial ITO-(P$^+$Nn$^+$)Si-ITO Laminated Grid Cell," 16$^{th}$ European Photovoltaic Solar Energy Conference, May 1-5, 2000, Glasgow, UK, pp. 1489-1491.

PCT/US2009/043989; International Search Report & Written Opinion, Dec. 22, 2009.

PCT/US2009/062016; International Search Report & Written Opinion, May 20, 2010.

U.S. Appl. No. 12/644,324, "Diode Rail System for Photovoltaic Modules," Andrew J. Zeiner, filed Dec. 22, 2009.

* cited by examiner

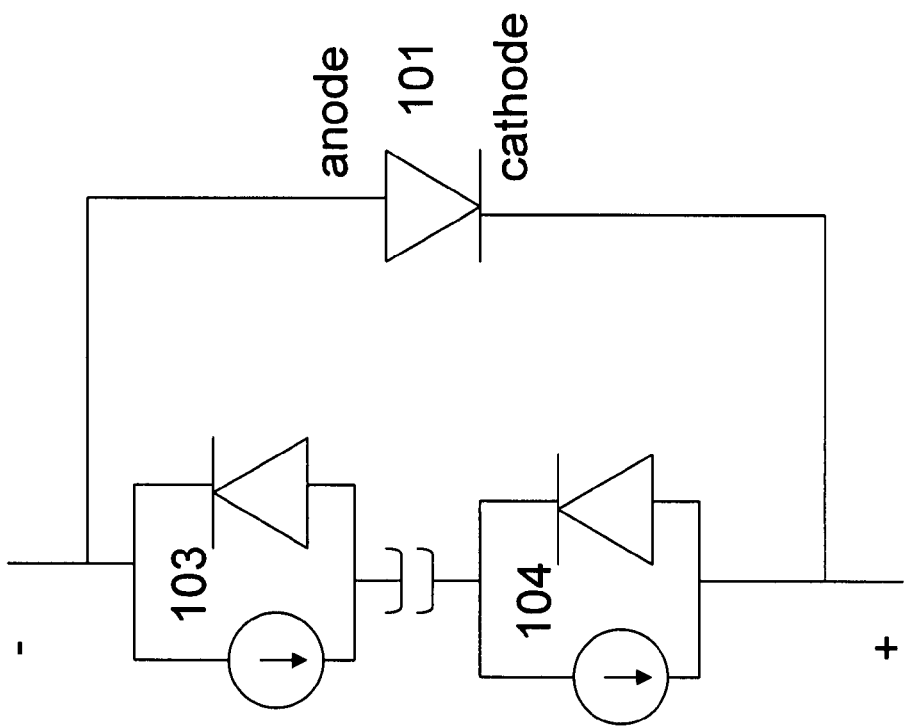
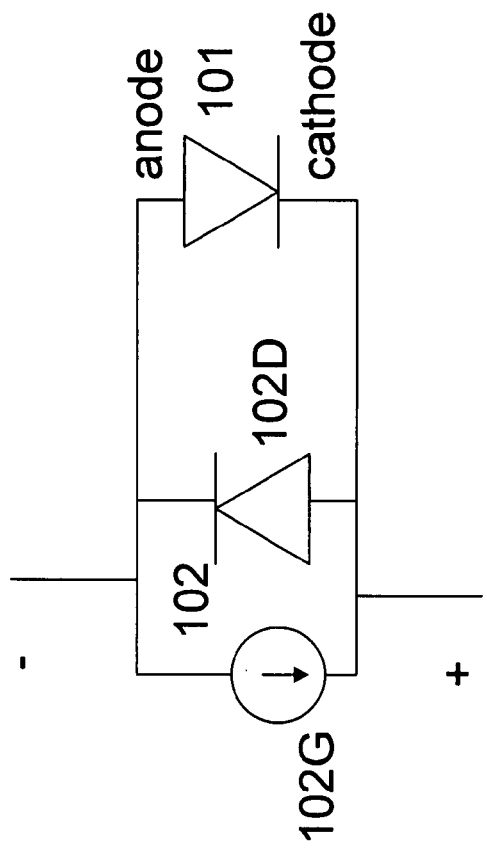

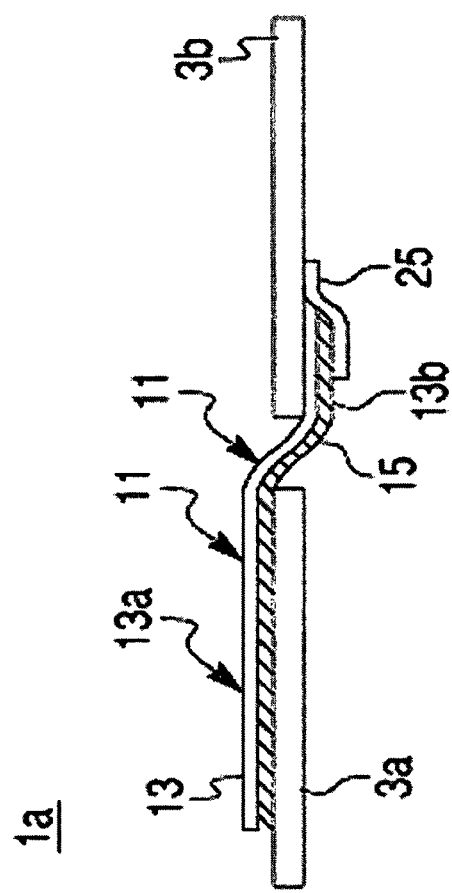
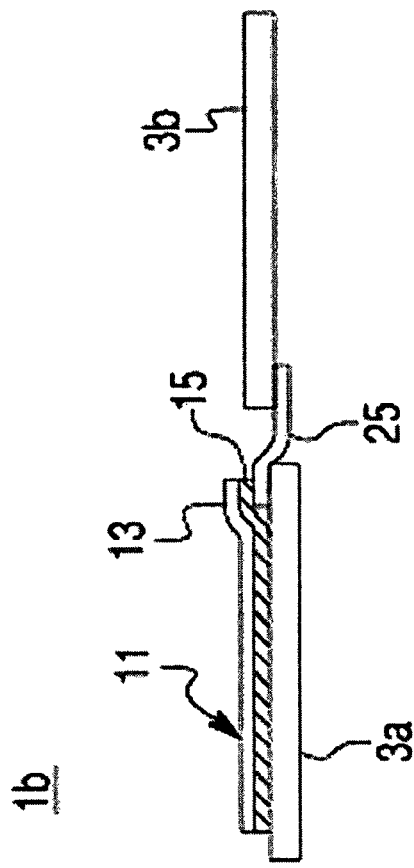

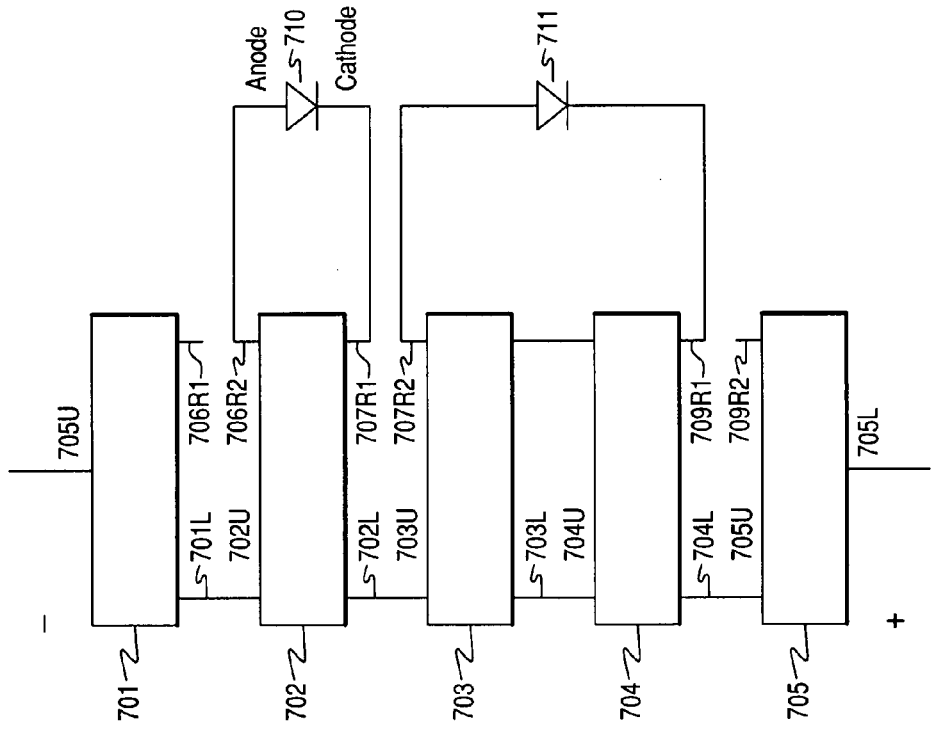
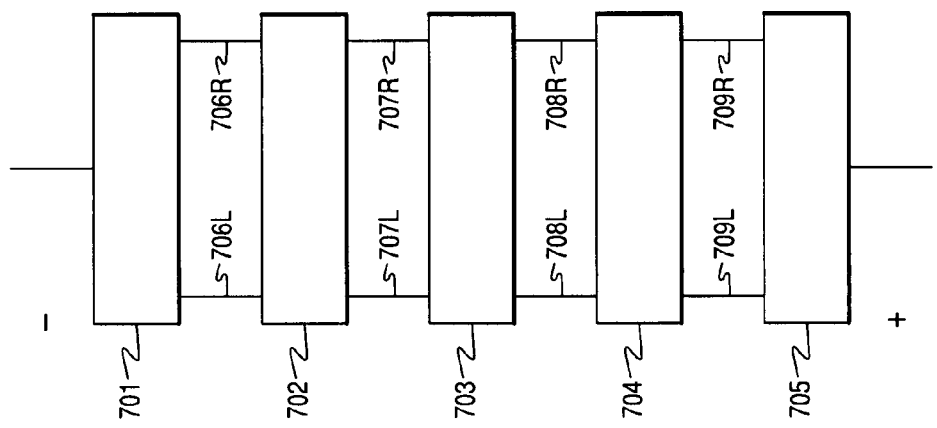

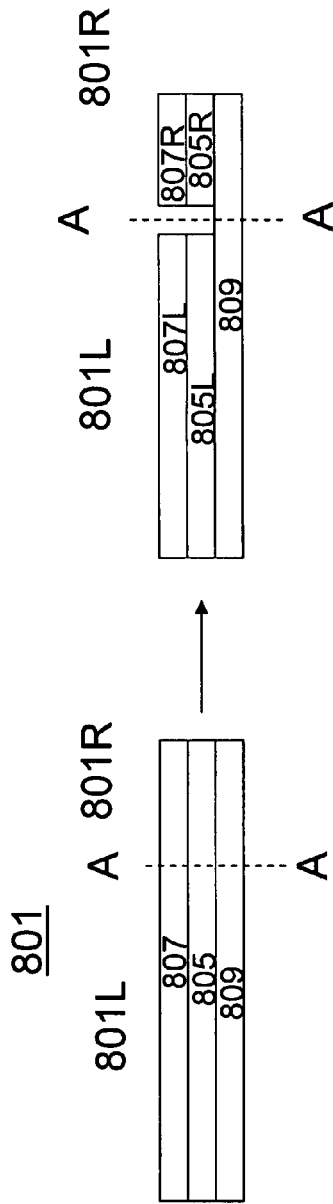
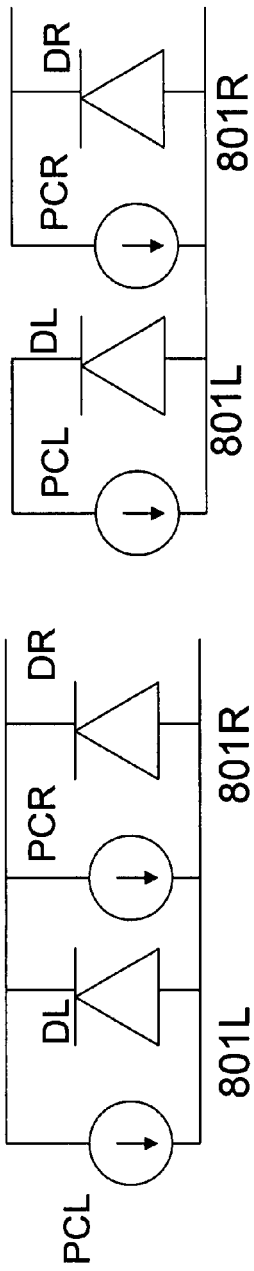
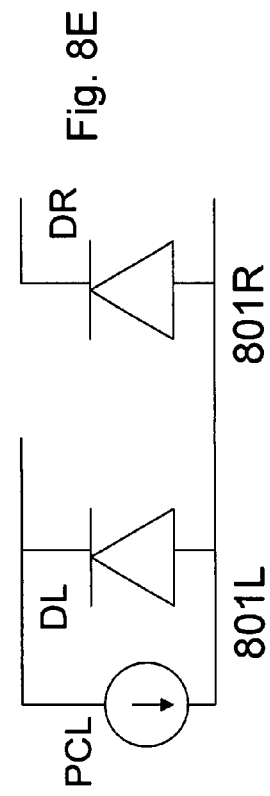
Fig. 8A  Fig. 8B  Fig. 8C  Fig. 8D  Fig. 8E

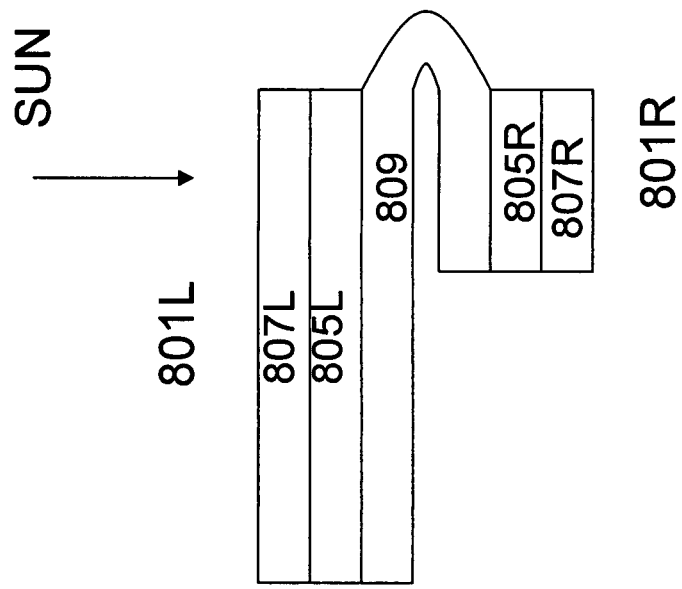
FIGURE 12B
FIGURE 12A

PHOTOVOLTAIC MODULE UTILIZING AN INTEGRATED FLEX CIRCUIT AND INCORPORATING A BYPASS DIODE

FIELD

The present invention relates generally to a photovoltaic device and more particularly to photovoltaic modules incorporating bypass diodes.

BACKGROUND

Photovoltaic (PV) modules that include a plurality of photovoltaic cells connected in series utilize bypass diodes to route current around shaded or damaged cells. Most of the existing commercial PV modules use one bypass diode per string of PV cells. Some use none. Existing methods of incorporating bypass diodes in PV modules are cumbersome, costly and often require a junction box or a secondary stringing operation. Moreover, currently used diodes are frequently plagued by failures from overcurrent and overheating.

A need exists to develop alternative photovoltaic modules that incorporate bypass diodes and alternative methods for incorporating bypass diodes in photovoltaic modules.

SUMMARY

In one embodiment, the invention provides a photovoltaic module comprising a plurality of photovoltaic cells comprising a first photovoltaic cell and a second photovoltaic cell; a collector-connector configured to collect a current from the first photovoltaic cell and electrically connect the first photovoltaic cell to the second photovoltaic cell; and at least one diode configured to bypass at least one cell of the plurality of photovoltaic cells.

In another embodiment, the invention provides a photovoltaic module comprising
a plurality of cells that includes a first photovoltaic cell and a second photovoltaic cell, wherein the first photovoltaic cell comprises an active portion and a shaded portion configured as a diode bypassing the first photovoltaic cell.

In yet another embodiment, the invention provides a method of making a photovoltaic module comprising providing a plurality of photovoltaic cells that comprises a first photovoltaic cell and a second photovoltaic cell; and separating the first photovoltaic cell into an active portion and a shaded portion; and electrically connecting the shaded portion of the first photovoltaic cell to the second photovoltaic cell so that the shaded portion is configured as a diode bypassing the second photovoltaic cell.

DRAWINGS

FIG. 1A schematically illustrates a diode bypassing one photovoltaic cell. FIG. 1B schematically illustrates a circuit schematic of diode bypassing multiple photovoltaic cells connected in series.

FIG. 2 schematically illustrates a side photovoltaic module that includes two photovoltaic cells and a flexible collector-connector.

FIGS. 3 and 4 schematically illustrate a cross sectional view of photovoltaic module that includes two photovoltaic cells and a flexible collector-connector.

FIG. 7A-B schematically illustrate a photovoltaic module with conductors having breaks between adjacent photovoltaic cells.

FIG. 8A-B schematically illustrate a photovoltaic cell that contains an active portion and a shaded portion and a process of making such a cell.

FIG. 8C-E present circuit schematics circuit schematics for a photovoltaic cell that contains an active portion and a shaded portion.

Figure 9:
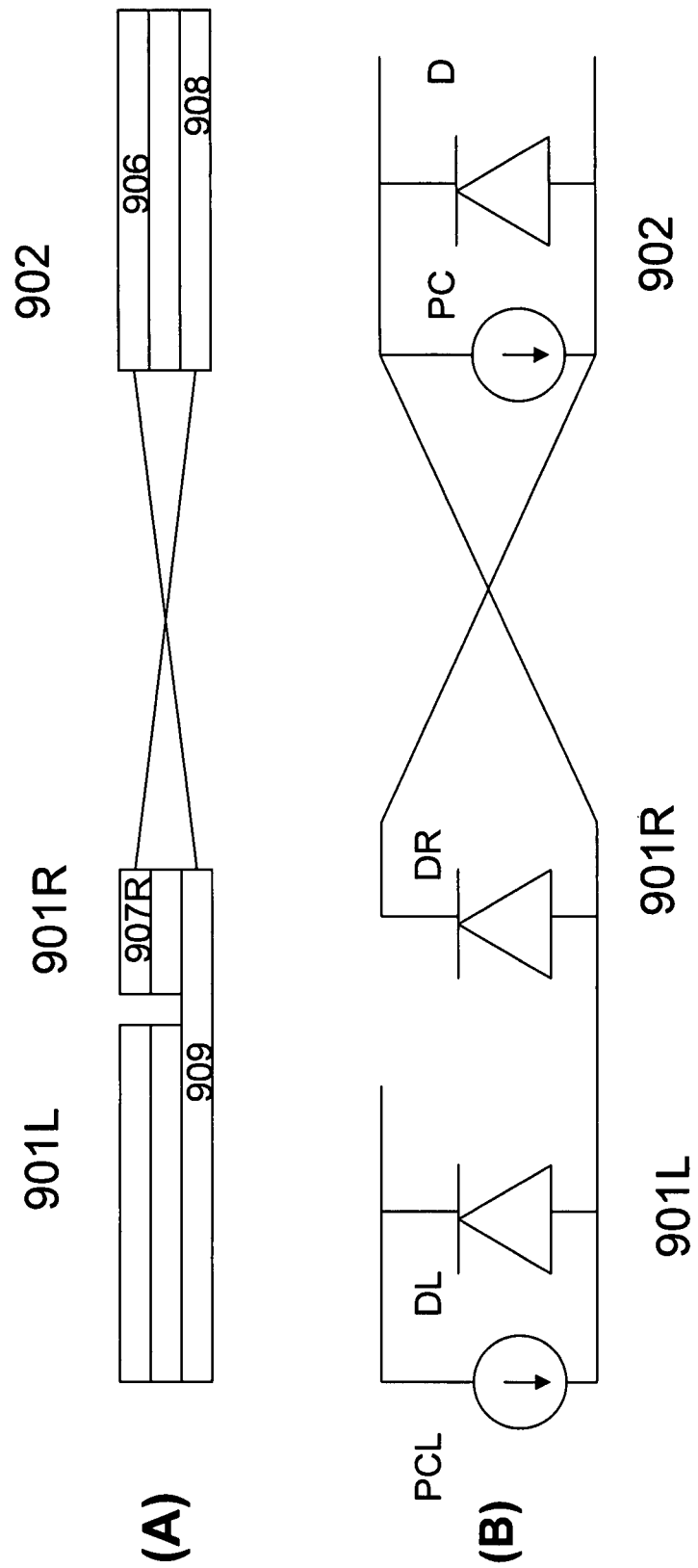

FIG. 9A schematically illustrate an electrical connection of two photovoltaic cells such that a shaded portion of one cell acts as a bypass diode for the other.

FIG. 9B presents circuit schematics for the two photovoltaic cells in FIG. 9A.

Figure 10B:
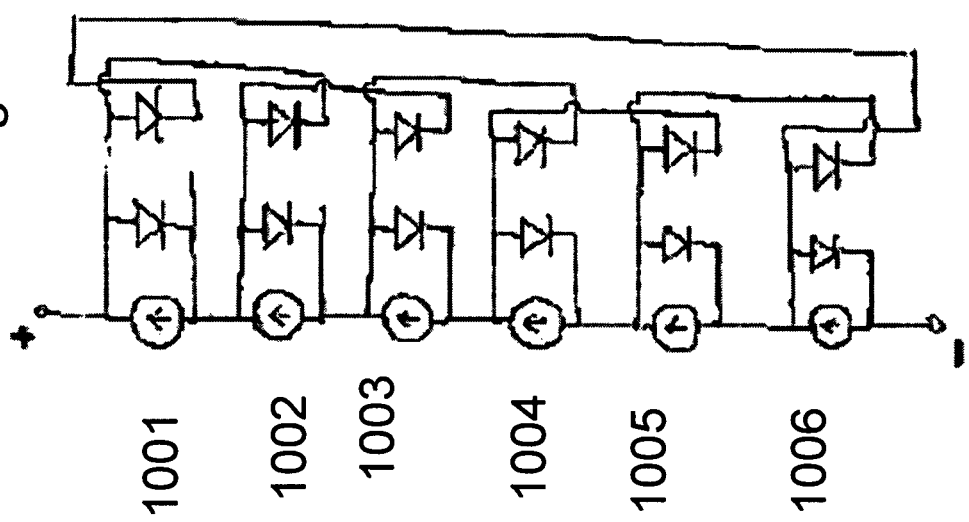
Figure 10A:
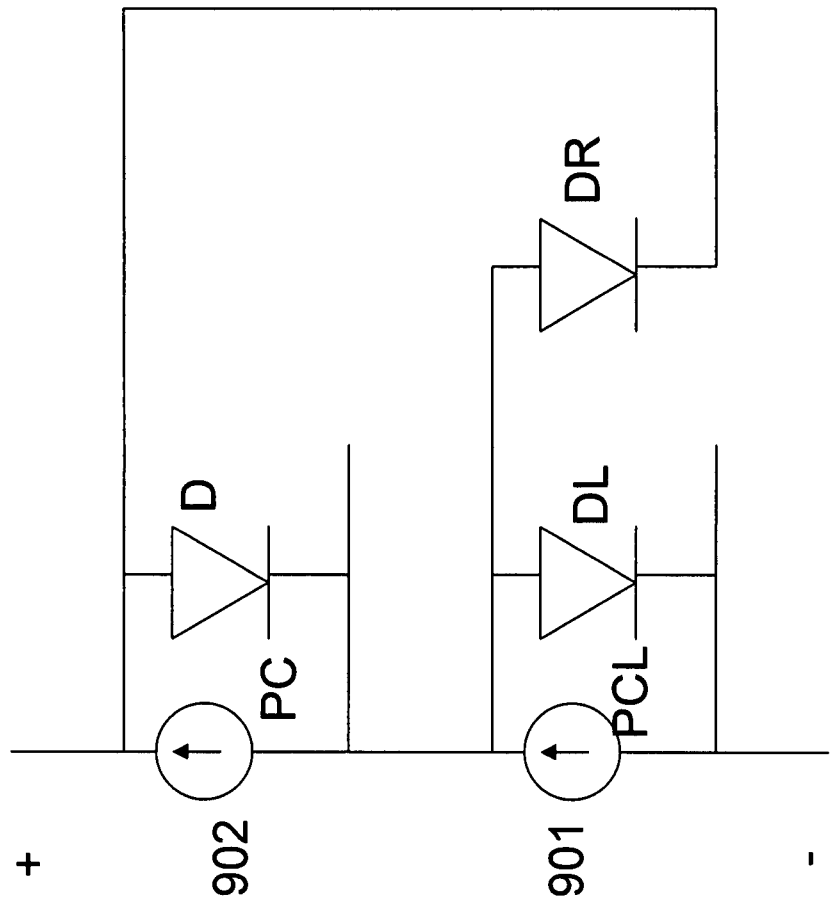

FIG. 10A illustrates circuit schematic of an electrical connection of two photovoltaic cells such that a shaded portion of one cell acts as a bypass diode for the other. FIG. 10B is a circuit diagram illustrating an electrical connection of multiple photovoltaic cells, each containing an active portion and a shaded portion, such that an active portion of one cell acts as a bypass diode for another cell.

Figure 11:
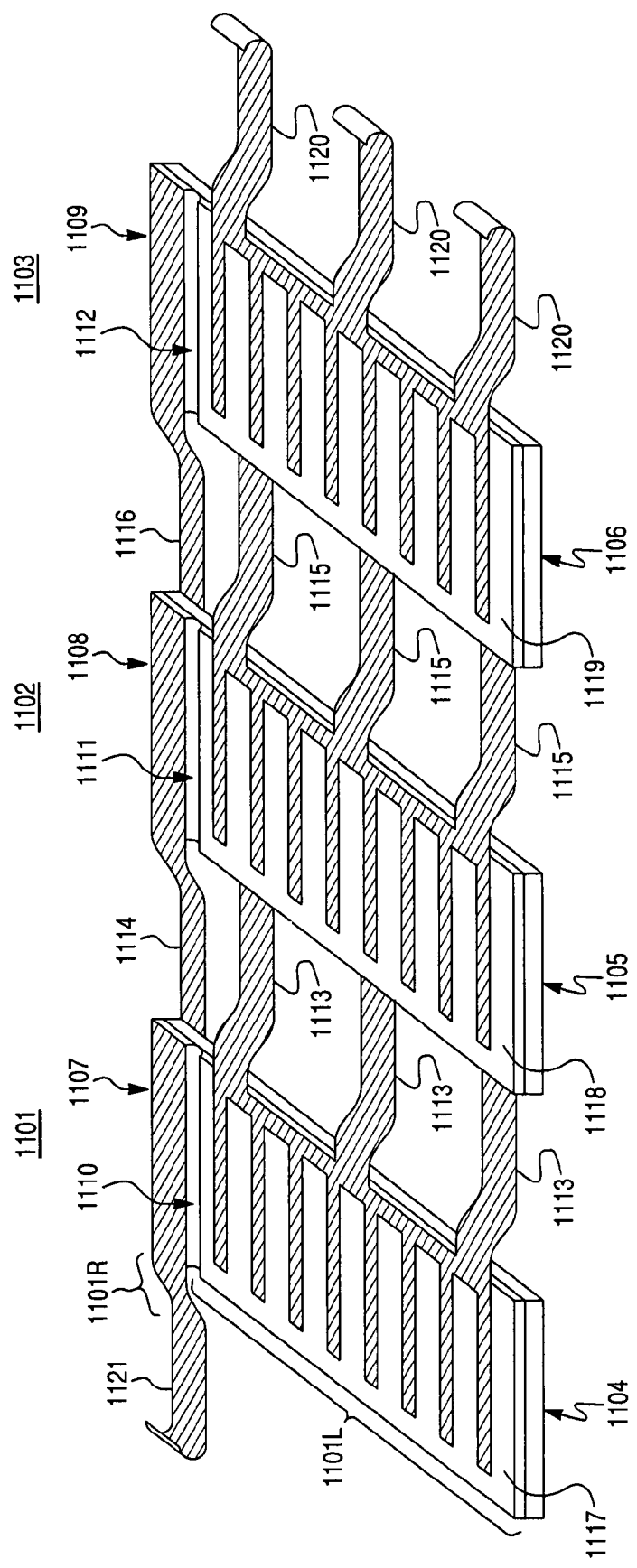

FIG. 11 is a 3D view of a photovoltaic module that includes a plurality of photovoltaic cells and a collector-connector, where a shaded portion of one photovoltaic cell acts as a bypass diode for another photovoltaic cell.

FIG. 12A schematically depicts a side cross-sectional view of a photovoltaic cell analogous to the one depicted in FIG. 8B. FIG. 12B schematically depicts a side cross-sectional view photovoltaic cell that has a shaded portion of a first polarity electrode turned away from the Sun.

DETAILED DESCRIPTION

Unless otherwise specified "a" or "an" means one or more.

The term "bypass diode" means a diode connected to one or more photovoltaic cells of a photovoltaic module such that the diode will conduct electrical current if the cell(s) become damaged or shaded. A bypass diode is usually connected anti-parallel to a single photovoltaic cell or plural photovoltaic cells connected in series. FIG. 1A illustrates a bypass diode 101 connected anti-parallel to a photovoltaic cell 102 schematically depicted as a voltage generator 102G and a diode 102D connected in parallel. The voltage generator 102G represents the photovoltaic cell 102 in a normal mode and the diode 102D represents the photovoltaic cell 102 in a reverse bias mode. The anti-parallel connection of the diode 101 to the photovoltaic cell 102 means that the diode 101 is anti-parallel to the diode 102D. In other words, the anti-parallel connection of the diode 101 to the photovoltaic cell 102 means that the anode of the diode 101 is connected to the cathode of the photovoltaic cell 102 and the cathode of the diode 101 is connected to the anode of the photovoltaic cell 102. When the photovoltaic cell 102 is damaged or shaded, the electrical current will run through the diode 101 according to FIG. 1A.

FIG. 1B illustrates a bypass diode 101 connected anti-parallel to a series of photovoltaic cells with terminal cells 103 and 104. The anti-parallel connection as illustrated in FIG. 1B means that the anode of the diode 101 is electrically connected to the cathode of the terminal cell 103 and the cathode of the diode is electrically connected to the anode of the terminal cell 104. When any one or more of the photovoltaic cells in the series with terminal cells 103 and 104 get damaged or shaded, the diode 101 will conduct the electrical current.

The present inventors developed new ways of incorporating bypass diodes in photovoltaic modules. Accordingly, the invention relates to a photovoltaic module that includes at least one diode configured to bypass at least one photovoltaic cell of the module and methods of making a photovoltaic module that includes at least one bypass diode.

According to one embodiment, a photovoltaic module includes at least two photovoltaic cells, a collector-connector and a diode configured to bypass one or more photovoltaic cells of the module. Photovoltaic modules that include a collector-connector are disclosed, for example, in U.S. patent application Ser. No. 11/451,616 filed Jun. 13, 2006 to Hachtmann et al. incorporated herein by reference in its entirety. As used herein, the term "module" includes an assembly of at least two, and preferably three or more electrically interconnected photovoltaic cells, which may also be referred to as "solar cells". The "collector-connector" is a device that acts as both a current collector to collect current from at least one photovoltaic cell of the module, and as an interconnect which electrically interconnects the at least one photovoltaic cell with at least one other photovoltaic cell of the module. In general, the collector-connector takes the current collected from each cell of the module and combines it to provide a useful current and voltage at the output connectors of the module.

Figure 2:
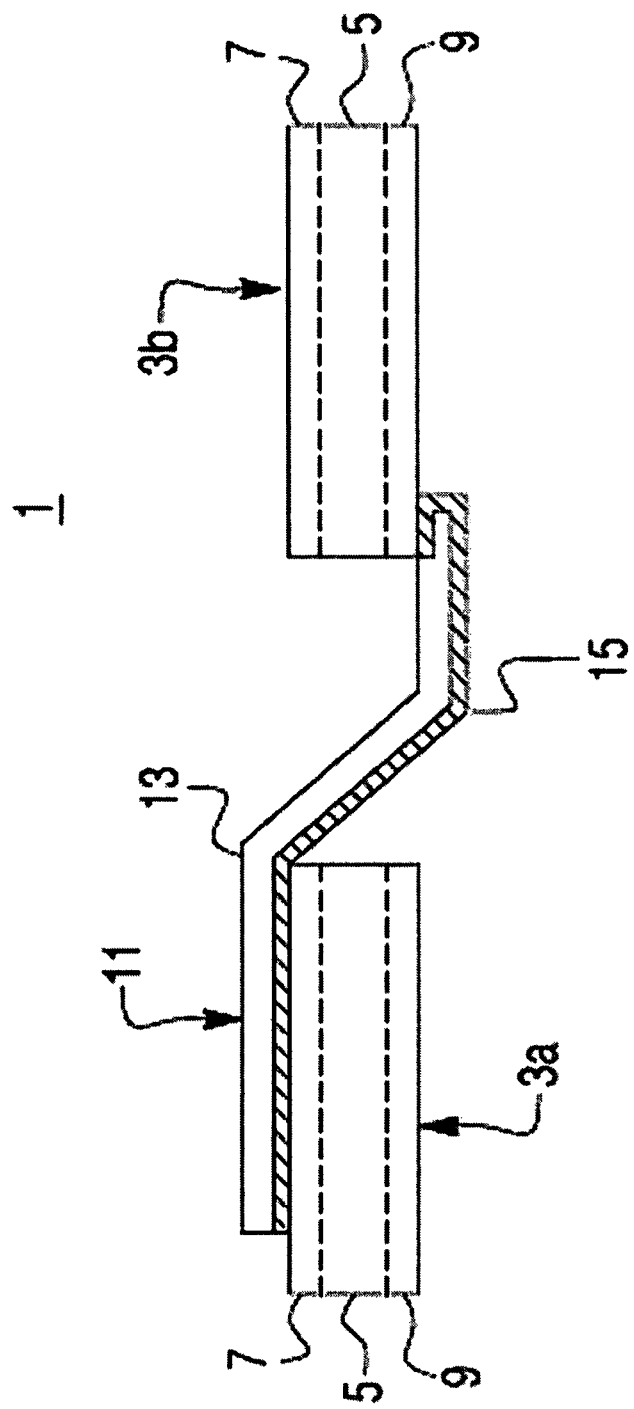

FIG. 2 schematically illustrates two versions a module 1. The module 1 includes first and second photovoltaic cells 3a and 3b. It should be understood that the module 1 may contain three or more cells, such as 3-10,000 cells for example. Preferably, the first 3a and the second 3b photovoltaic cells are plate shaped cells which are located adjacent to each other, as shown schematically in FIG. 2. The cells may have a square, rectangular (including ribbon shape), hexagonal or other polygonal, circular, oval or irregular shape when viewed from the top.

Each cell 3a, 3b includes a photovoltaic material 5, such as a semiconductor material. For example, the photovoltaic semiconductor material may comprise a p-n or p-i-n junction in a Group IV semiconductor material, such as amorphous or crystalline silicon, a Group II-VI semiconductor material, such as CdTe or CdS, a Group I-III-VI semiconductor material, such as $CuInSe_2$ (CIS) or $Cu(In,Ga)Se_2$ (CIGS), and/or a Group III-V semiconductor material, such as GaAs or InGaP. The p-n junctions may comprise heterojunctions of different materials, such as CIGS/CdS heterojunction, for example. Each cell 3a, 3b also contains front and back side electrodes 7, 9. These electrodes 7, 9 can be designated as first and second polarity electrodes since electrodes have an opposite polarity. For example, the front side electrode 7 may be electrically connected to an n-side of a p-n junction and the back side electrode may be electrically connected to a p-side of a p-n junction. The electrode 7 on the front surface of the cells may be an optically transparent front side electrode which is adapted to face the Sun, and may comprise a transparent conductive material, such as indium tin oxide or aluminum doped zinc oxide. The electrode 9 on the back surface of the cells may be a back side electrode which is adapted to face away from the Sun, and may comprise one or more conductive materials such as copper, molybdenum, aluminum, stainless steel and/or alloys thereof. This electrode 9 may also comprise the substrate upon which the photovoltaic material 5 and the front electrode 7 are deposited during fabrication of the cells.

Preferably, the carrier 13 comprises a flexible, electrically insulating polymer film having a sheet or ribbon shape, supporting at least one electrical conductor 15. Examples of suitable polymer materials include thermal polymer olefin (TPO). TPO includes any olefins which have thermoplastic properties, such as polyethylene, polypropylene, polybutylene, etc. Other polymer materials which are not significantly degraded by sunlight, such as EVA, other non-olefin thermoplastic polymers, such as fluoropolymers, acrylics or silicones, as well as multilayer laminates and co-extrusions, such as PET/EVA laminates or co-extrusions, may also be used. The insulating carrier 13 may also comprise any other electrically insulating material, such as glass or ceramic materials. The carrier 13 may be a sheet or ribbon which is unrolled from a roll or spool and which is used to support conductor(s) 15 which interconnect three or more cells 3 in a module 1. The carrier 13 may also have other suitable shapes besides sheet or ribbon shape.

The conductor 15 may comprise any electrically conductive trace or wire. Preferably, the conductor 15 is applied to an insulating carrier 13 which acts as a substrate during deposition of the conductor. The collector-connector 11 is then applied in contact with the cells 3 such that the conductor 15 contacts one or more electrodes 7, 9 of the cells 3. For example, the conductor 15 may comprise a trace, such as silver paste, for example a polymer-silver powder mixture paste, which is spread, such as screen printed, onto the carrier 13 to form a plurality of conductive traces on the carrier 13. The conductor 15 may also comprise a multilayer trace. For example, the multilayer trace may comprise a seed layer and a plated layer. The seed layer may comprise any conductive material, such as a silver filled ink or a carbon filled ink which is printed on the carrier 13 in a desired pattern. The seed layer may be formed by high speed printing, such as rotary screen printing, flat bed printing, rotary gravure printing, etc. The plated layer may comprise any conductive material which can by formed by plating, such as copper, nickel, cobalt or their alloys. The plated layer may be formed by electroplating by selectively forming the plated layer on the seed layer which is used as one of the electrodes in a plating bath. Alternatively, the plated layer may be formed by electroless plating. Alternatively, the conductor 15 may comprise a plurality of metal wires, such as copper, aluminum, and/or their alloy wires, which are supported by or attached to the carrier 13. The wires or the traces 15 electrically contact a major portion of a surface of the first polarity electrode 7 of the first photovoltaic cell 3a to collect current from this cell 3a. The wires or the traces 15 also electrically contact at least a portion of the second polarity electrode 9 of the second photovoltaic cell 3b to electrically connect this electrode 9 of cell 3b to the first polarity electrode 7 of the first photovoltaic cell 3a. The wires or traces 15 may form a grid-like contact to the electrode 7. The wires or traces 15 may include thin gridlines as well as optional thick busbars or buslines, as will be described in more detail below. If busbars or buslines are present, then the gridlines may be arranged as thin "fingers" which extend from the busbars or buslines.

The modules of the embodiments of the invention provide a current collection and interconnection configuration and method that is less expensive, more durable, and allows more light to strike the active area of the photovoltaic module than the prior art modules. The module provides collection of current from a photovoltaic ("PV") cell and the electrical interconnection of two or more PV cells for the purpose of transferring the current generated in one PV cell to adjacent cells and/or out of the photovoltaic module to the output connectors. In addition, the carrier is may be easily cut, formed, and manipulated. In addition, when interconnecting thin-film solar cells with a metallic substrate, such as stainless steel, the embodiments of the invention allow for a better thermal expansion coefficient match between the interconnecting solders used and the solar cell than with traditional solder joints on silicon PV cells) In particular, the cells of the module may be interconnected without using soldered tab and string interconnection techniques of the prior art. However, soldering may be used if desired.

FIGS. 3 and 4 illustrate modules 1a and 1b, respectively, in which the carrier film 13 contains conductive traces 15 printed on one side. The traces 15 electrically contact the active surface of cell 3a (i.e., the front electrode 7 of cell 3a) collecting current generated on that cell 3a. A conductive interstitial material may be added between the conductive trace 15 and the cell 3a to improve the conduction and/or to stabilize the interface to environmental or thermal stresses. The interconnection to the second cell 3b is completed by a conductive tab 25 which contacts both the conductive trace 15 and the back side of cell 3b (i.e., the back side electrode 9 of cell 3b). The tab 25 may be continuous across the width of the cells or may comprise intermittent tabs connected to matching conductors on the cells. The electrical connection can be made with conductive interstitial material, conductive adhesive, solder, or by forcing the tab material 25 into direct intimate contact with the cell or conductive trace. Embossing the tab material 25 may improve the connection at this interface. In the configuration shown in FIG. 3, the collector-connector 11 extends over the back side of the cell 3b and the tab 25 is located over the back side of cell 3b to make an electrical contact between the trace 15 and the back side electrode of cell 3b. In the configuration of FIG. 4, the collector-connector 11 is located over the front side of the cell 3a and the tab 25 extends from the front side of cell 3a to the back side of cell 3b to electrically connect the trace 15 to the back side electrode of cell 3b.

In summary, in the module configuration of FIGS. 3 and 4, the conductor 15 is located on one side of the carrier film 13. At least a first part 13a of carrier 13 is located over a front surface of the first photovoltaic cell 3a such that the conductor 15 electrically contacts the first polarity electrode 7 on the front side of the first photovoltaic cell 3a to collect current from cell 3a. An electrically conductive tab 25 electrically connects the conductor 15 to the second polarity electrode 9 of the second photovoltaic cell 3b. Furthermore, in the module 1a of FIG. 3, a second part 13b of carrier 13 extends between the first photovoltaic cell 3a and the second photovoltaic cell 3b, such that an opposite side of the carrier 13 from the side containing the conductor 15 contacts a back side of the second photovoltaic cell 3b.

Figure 5:
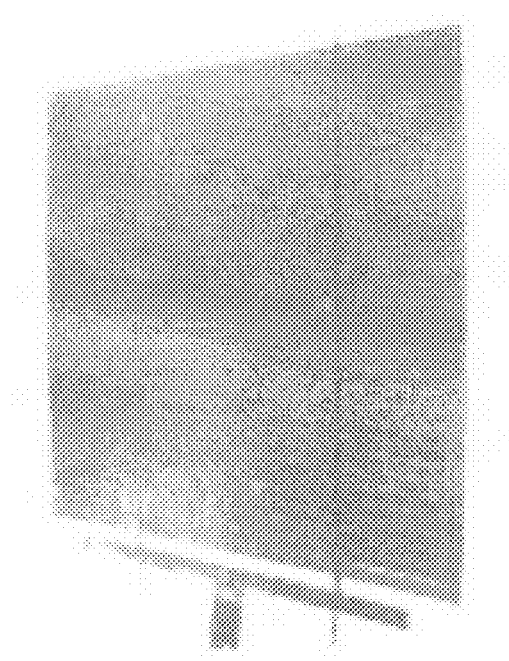
FIG. 5 is a photograph of a flexible Cu(In,Ga)Se$_2$ (CIGS) cell formed on flexible stainless steel substrate.
Figure 6:
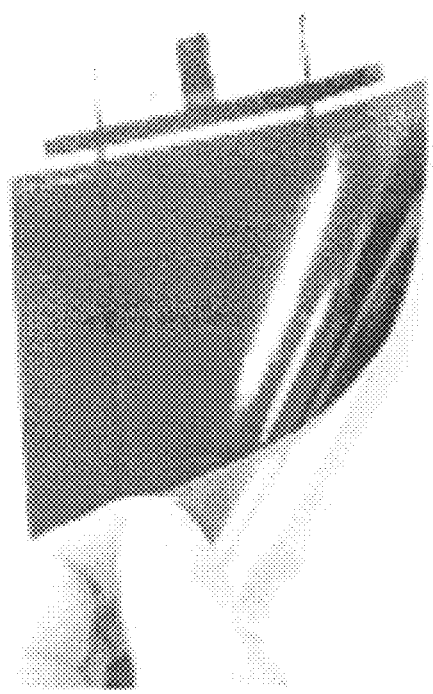
FIG. 6 is a photograph illustrating a flexible nature of the CIGS cell formed on flexible stainless steel substrate.

FIGS. 5 and 6 are photographs of flexible CIGS PV cell modules formed on flexible stainless steel substrates. The collector-connector containing a flexible insulating carrier and conductive traces shown in FIG. 3 and described above is formed over the top of the cells. FIG. 6 illustrates the flexible nature of the cell, which is being lifted and bent by hand.

In some embodiments, the bypass diode can be incorporated in the photovoltaic module by providing in the collector-connector a first wire or trace for electrically contacting a first electrode of the bypass diode and a second wire or trace for electrically contacting a second electrode of the bypass diode. If the diode is configured to bypass only one cell of the module, then the first wire or trace and the second wire or trace are electrically contacted to the first and the second polarity electrodes of that cell, respectively. If the diode is configured to bypass more than one cell of the module, e.g. the diode is configured to bypass all the cells in series with terminal cells A and B, then the first wire or trace is electrically contacted to the first polarity electrode of the cell A and the second wire or trace is electrically contacted to the second polarity electrode of the cell B. The first wire or trace and the second wire or trace can be introduced in the collector-connector during its formation.

The first wire or trace and/or the second wire or trace can be introduced in the collector-connector by producing one or more breaks of the conductors 15 of the collector-connector. For example, FIG. 7A illustrates a photovoltaic module that includes five photovoltaic cells 701, 702, 703, 704 and 705 electrically connected in series. In FIG. 7A, the collector-connector includes conductors 706L and 706R connecting adjacent cells 701 and 702, conductors 707L and 707R connecting adjacent cells 702 and 703, conductors 708L and 708R connecting adjacent cells 703 and 704 and conductors 709L and 709R connecting adjacent cells 704 and 705. An introduction of a single bypass diode may require a first break in one or more conductors connecting a first pair of adjacent photovoltaic cells of the module and a second break in one or more conductors connecting a second pair of adjacent photovoltaic cells of the module.

A break is introduced in conductors connecting a pair of adjacent cells in such a fashion that at least one conductor remains unbroken and thus provides an electrical connection between the pair of adjacent cells. Thus, a break can be introduced only in one, but not both, of the conductors 706L and 706R connecting cells 701 and 702 in FIG. 7.

To introduce a diode bypassing a single photovoltaic cell of the module, one break can be introduced in conductors connecting a first polarity electrode of the cell to a first adjacent cell and in conductors connecting a second polarity electrode of the cell to a second adjacent cell. In FIG. 7B, a break in conductor 706R produces a wire or trace 706R2 connected to a first polarity electrode 702U of the cell 702 and a wire or trace 706R1 connected to a second polarity electrode 701L of the cell 701, while a break in conductor 707R produces a wire or trace 707R1 connected to a second polarity electrode 702L of the cell 702 and a wire or trace 707R2 connected to a first polarity electrode 703U of the cell 703. A diode 710 bypassing the cell 702 has its anode connected to the wire or trace 706R2 and its cathode connected to the wire or trace 707R1.

To introduce a diode bypassing multiple cells electrically connected in series, breaks can be produced only in conductors connecting the terminal cells of the series to cells outside of the series. Thus, breaks in conductors of the collector-connector connecting cells inside the series are not necessary. For example, in FIG. 7B, a diode 711 is configured to bypass cells 703 and 704 electrically connected in series. Accordingly, breaks are produced in the wire or trace 707R connecting the first terminal cell of the series 703 to the outside cell 702 and in the wire or trace 709R connecting the second terminal cell of the series 704 to the outside cell 705. No break is necessary in conductors, such as conductors 708L or 708R, connecting the cells of the series 703 and 704.

Similarly, to incorporate a diode bypassing cells 702, 703 and 704 electrically connected in series, breaks can be produced in one or more conductors, such as conductors 706L or 706R, connecting the first terminal cell of the series 702 to the outside cell 701 and in one or more conductors, such as conductors 709L or 709R, connecting the second terminal cell of the series 704 to the outside cell 705. No breaks are necessary in either conductors, such as conductors 708L or 708R, connecting the cells of the series 703 and 704, or in conductors, such as conductors 707L or 707R, connecting the cells of the series 702 and 703.

The diode incorporated in the photovoltaic module can be in any appropriate form. In some embodiments, the diode can be a part of an integrated circuit (IC), such as a surface mount IC or a cylindrical IC. The integrated circuit can have metallic leads which can be directly connected to wires or traces of the collector-connector.

The diode can be attached to the first wire or trace and the second wire or trace using any appropriate method known in the art, such as soldering or using conductive adhesives.

According to a second embodiment, a photovoltaic module includes at least two photovoltaic cells such that one of the cells has an active portion and a shaded portion that is configured to bypass another photovoltaic cell.

The active portion and the shaded portion of the cell share one polarity electrode and have separate shaded electrodes of one polarity. For example, the active portion and the shaded portion can have a common second polarity electrode and separate first polarity electrodes.

The photovoltaic cell schematically depicted in FIG. 8B has an active portion 801L and a shaded portion 801R that have a common back side electrode 809 and separate front side electrodes 807L and 807R respectively. Electrodes 807L and 807R are electrically insulated from each other. The material of the electrodes 807L and 807R can the same or different. The active portion 801L includes a semiconductor photovoltaic material 805L disposed between electrodes 807L and 809 and the shaded portion includes a semiconductor material 805R disposed between electrodes 807R and 809. The composition of the photovoltaic material 805L and the semiconductor material 805R can be the same or different.

FIG. 8A-B illustrates a process of making a photovoltaic cell that has an active portion and a shaded portion. The photovoltaic cell 801 in FIG. 8A includes a first polarity electrode 807, a second polarity electrode 809 and a photovoltaic material disposed between the electrodes 807 and 809. An imaginary line A-A separates the photovoltaic cell into left and right subcells 801L and 801R. The right and the left subcells 801L and 801R in FIG. 8A share the first polarity electrode 807, photovoltaic material 805 and second polarity electrode 809. FIG. 8C presents a diagram illustrating an electrical connection of the left and right subcells 801L and 801R as depicted in FIG. 8A. In FIG. 8C, the left subcell 801L is depicted as a photovoltaic cell PCL and a diode DL connected in parallel and the right subcell 801R is depicted as a photovoltaic PCR and a diode DR connected in parallel. In FIG. 8C the left subcell 801L and the right subcell 801R are electrically connected in parallel.

In FIG. 8B, the left and the right subcells are separated along the line A-A so that the first polarity electrode 807L of the left subcell is not electrically connected to the first polarity electrode 807R of the right subcell, the photovoltaic material 805L of the left subcell is physically separated and electrically isolated from the photovoltaic material 805R of the right subcell, while the second polarity electrode 809 remains common for the left and the right subcell. FIG. 8D depicts an electrical diagram of the electrical connection of the left and the right subcells 801L and 801R after separation. In FIG. 8D, the left subcell 801L is depicted as the photovoltaic cell PCL and the diode DL connected in parallel and the right subcell 801R is depicted as the photovoltaic PCR and the diode DR connected in parallel. The left subcell 801L and the right subcell 801R are not connected in parallel as they share only one common electrode.

The separation of the photovoltaic cell into the left subcell and the right subcell can be performed by any applicable method. In some embodiments, the left and right subcells can be separated by scribing though the first polarity electrode 807 and the photovoltaic material 805 of the photovoltaic cell 801. Such method of separation can be performed, for example, on plate shaped photovoltaic cells described above. Plate shaped photovoltaic cells separated into active and shaded portions by scribing are depicted in FIG. 11. For example, a photovoltaic cell 1101 has a gap 1110 scribed through its front side electrode and photovoltaic material. The gap 1110 separates the cell 1101 into an active portion, which has a front side electrode 1117, and a shaded portion, which has a front side electrode 1107. The active and the shaded portions of the cell 1101 share a common back side electrode 1104.

Upon the separation, one of the left and right subcells can be selected as an active portion of the photovoltaic cell, while the other of the left and right subcells can be selected as a shaded portion of the photovoltaic cell. The subcell selected as the shaded portion can be shaded so that it can act only as a bypass diode instead of a photovoltaic cell.

FIG. 8E depicts an electrical diagram of the photovoltaic cell 801 of FIG. 8B with the right subcell 801R being shaded.

Shading can be performed by a variety of techniques. In some embodiments, shading can be performed by disposing a non-transparent layer over the first polarity electrode of the subcell selected as the shaded portion, such as the right subcell 801R on FIG. 8E. In some embodiments, shading can be carried out by bending the common electrode of the subcells, i.e. the second polarity electrode 809 in FIG. 8, in such a manner that the first polarity electrode of the subcell selected as the shaded portion faces away from the Sun when the first polarity of the subcell selected as the active portion faces toward the Sun. FIG. 12B illustrates such an embodiment. In FIG. 12B, the common electrode 809 of the flexible subcells 801L and 801R is bent so that the first polarity electrode 807R of the right subcell 807R faces away from the Sun.

FIG. 9A illustrates a connection of a photovoltaic cell 901 that has an active portion 901L and a shaded portion 901R to a photovoltaic cell 902 having active 902L and shaded 902R portions so that the shaded portion 901R is configured as a diode bypassing the photovoltaic cell 902. In other words, a first polarity electrode 907R of the shaded portion 901R of the photovoltaic cell 901 is electrically connected to a second polarity electrode 908 of the photovoltaic cell 902 and a first polarity electrode 906 of the photovoltaic cell 902 is electrically connected to a second polarity electrode 909 of the photovoltaic cell 901. If the photovoltaic cell 902 itself has an active portion and a shaded portion, the second polarity electrode 909 of the photovoltaic cell 901 is electrically connected to a first polarity electrode of an active portion of the photovoltaic cell 902.

FIG. 9B is an electrical diagram corresponding to photovoltaic cell arrangement of FIG. 9A. In FIG. 9B, the active portion 901L of the photovoltaic cell 901 is depicted as a photovoltaic cell PCL and a diode DL electrically connected in parallel, the shaded portion 901R of the photovoltaic cell 901 is depicted as a diode DR, and the photovoltaic cell 902 is depicted as a photovoltaic cell PC and a diode D connected in parallel. In FIG. 9B, the diode DR bypasses the photovoltaic cell PC.

FIG. 10A represents an electrical diagram of FIG. 9B redrawn so that the cell 901 is illustrated above the cell 902 to clarify the electrical connection.

FIG. 10B represents a diagram depicting an electrical connection of multiple photovoltaic cells such that each of the photovoltaic cells has an active portion and a shaded portion and a shaded portion of each of the cells configured as a diode bypassing an active portion of another cell. In FIG. 10B, a shaded portion of the cell 1002 (shown on the right side) is a diode bypassing an active portion of the cell 1001 (shown on the left side); a shaded portion of the cell 1003 is a diode bypassing an active portion of the cell 1002; a shaded portion of the cell 1004 is a diode bypassing an active portion of the cell 1003; a shaded portion of the cell 1005 is a diode bypassing an active portion of the cell 1004; a shaded portion of the cell 1006 is a diode bypassing an active portion of the cell 1005 and a shaded portion of the cell 1001 is a diode bypassing an active portion of the cell 1006.

FIG. 11 illustrates a photovoltaic module that includes photovoltaic cells 1101, 1102 and 1103. The photovoltaic cell 1101 has an active portion 1101L and a shaded portion 1101R, which share a common back side electrode 1104. The active portion of the cell 1101 has a front side electrode 1117, the shaded portion of the cell has a front side electrode 1107. The front side electrodes of the active and shaded portions are separated by a scribed gap 1110. The photovoltaic cell 1102 has an active portion and a shaded portion, which share a common back side electrode 1105. The active portion of the cell 1102 has a front side electrode 1118, the shaded portion of the cell has a front side electrode 1108. The front side electrodes of the active and shaded portions are separated by a scribed gap 1111. The photovoltaic cell 1103 has an active portion and a shaded portion, which share a common back side electrode 1106. The active portion of the cell 1103 has a front side electrode 1119, the shaded portion of the cell has a front side electrode 1109. The front side electrodes of the active and shaded portions are separated by a scribed gap 1112.

The photovoltaic module depicted in FIG. 11 has a collector-connector that includes conductors 1113 and 1114. The conductors 1113 connect the back side electrode 1105 of the cell 1102 to the front side electrode 1117 of the active portion of the cell 1101 and the conductor 1114 connects the front side electrode 1108 of the shaded portion of the cell 1102 to the back side electrode 1104 of the cell 1101. The conductor 1114 provides shading for the front side electrode 1108 of the shaded portion of the photovoltaic cell 1102. As presented in FIG. 11, the shaded portion of the cell 1108 is configured as a diode bypassing the active portion of the cell 1101.

The photovoltaic module depicted in FIG. 11 also includes a collector-connector that contains conductors 1115 and 1116. The conductors 1115 connect the back side electrode 1106 of the cell 1103 to the front side electrode 1118 of the active portion of the cell 1102, while the conductor 1116 connects the front side electrode 1109 of the shaded portion of the cell 1103 to the back side electrode 1105 of the cell 1102. The conductor 1116 provides shading for the front side electrode 1109 of the shaded portion of the photovoltaic cell 1103. As presented in FIG. 11, the shaded portion of the cell 1109 is configured as a diode bypassing the active portion of the cell 1102.

FIG. 11 also shows electrodes 1120 which can electrically connect the front side electrode 1119 of the active portion of the cell 1103 to another cell (not shown) of the module. Electrode 1121 provides shading for the front side electrode 1107 of the shaded portion of the cell 1101. Electrode 1121 can be connected to a back side electrode of another (not shown) cell in order for the shaded portion of the cell 1101 to be configured as a diode bypassing such another cell.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. All of the publications, patent applications and patents cited herein are incorporated herein by reference in their entirety.

What is claimed is:

1. A photovoltaic module, comprising:
  a plurality of photovoltaic cells comprising a first photovoltaic cell and a second photovoltaic cell;
  a collector-connector comprising an electrically insulating carrier and at least one flexible, electrically conductive first wire, the first wire configured to collect a current from a first polarity electrode of the first photovoltaic cell and electrically connect the first photovoltaic cell to a second polarity electrode of the second photovoltaic cell, wherein the first wire electrically contacts a major portion of a surface of the first polarity electrode; and
  at least one diode configured to bypass at least one cell of the plurality of photovoltaic cells,
    wherein the first photovoltaic cell comprises an active portion and a shaded portion configured as a diode bypassing the second photovoltaic cell,
    wherein the first photovoltaic cell comprises a first polarity electrode comprising a transparent portion facing the Sun and a shaded portion electrically insulated from the transparent portion, a second polarity electrode facing away from the Sun and a photovoltaic material disposed between the first polarity electrode and the second polarity electrode, the photovoltaic material comprises a first portion and a second portion separated from the first portion by a gap, the first portion being disposed between the transparent portion of the first polarity electrode and the second polarity electrode and the second portion being disposed between the shaded portion of the first polarity electrode and the second polarity electrode,
    wherein the active portion of the first photovoltaic cell is defined by the transparent portion of the first polarity electrode of the first photovoltaic cell and the first portion of the photovoltaic material of the first photovoltaic cell,
    wherein the shaded portion of the first photovoltaic cell is defined by the shaded portion of the first polarity electrode of the first photovoltaic cell and the second portion of the photovoltaic material,
    wherein the active and the shaded portions of the first photovoltaic cell share the second polarity electrode of the first photovoltaic cell, and
    wherein a first polarity electrode of the second photovoltaic cell is electrically connected to the second polarity electrode of the first photovoltaic cell and the shaded portion of the first polarity electrode of the first photovoltaic cell is electrically connected to a second polarity electrode of the second photovoltaic cell.

2. The photovoltaic module of claim 1, wherein:
  the collector-connector further comprises a second wire electrically contacting a first electrode of the diode and a third wire electrically contacting a second electrode of the diode.

3. The photovoltaic module of claim 2, wherein the second wire electrically connects the first polarity electrode of the first photovoltaic cell to the first electrode of the diode, the third wire electrically connects the second polarity electrode of the first photovoltaic cell to the second electrode of the diode and wherein the diode is configured to bypass the first photovoltaic cell.

4. The photovoltaic module of claim 2, wherein the plurality of photovoltaic cells further comprises a third photovoltaic cell, the second wire electrically connects the first polarity electrode of the first photovoltaic cell to the first electrode of the diode and the third wire electrically connecting a second polarity electrode of the third photovoltaic cell to the second electrode of the diode and wherein the diode is configured to bypass the first photovoltaic cell and the third photovoltaic cell.

5. The photovoltaic module of claim 2, wherein the second wire is soldered to the first electrode of the diode or wherein the second wire is electrically contacted to the first electrode of the diode by a conductive adhesive.

6. The photovoltaic module of claim 2, further comprising an integrated circuit comprising the diode.

7. The photovoltaic module of claim 6, wherein the integrated circuit is a surface mount IC or a cylindrical IC.

8. The photovoltaic module of claim 1, wherein the collector-connector comprises a plurality of traces or wires that include at least one shading wire or trace disposed on the shaded portion of the first polarity electrode of the first photovoltaic cell such that the shading wire or trace blocks the Sunlight from the second portion of the photovoltaic material of the first photovoltaic cell.

9. The photovoltaic module of claim 1, wherein the shaded portion of the first polarity electrode of the first photovoltaic cell is configured to face away from the Sun.

10. The photovoltaic module of claim 1, wherein the at least one diode comprises a plurality of diodes configured so that at least one diode of the plurality of diodes bypasses each photovoltaic cell of the plurality of photovoltaic cells.

11. A photovoltaic module, comprising:
a plurality of photovoltaic cells comprising a first photovoltaic cell and a second photovoltaic cell;
a collector-connector comprising an electrically insulating carrier and at least one flexible, electrically conductive first wire, the first wire configured to collect a current from a first polarity electrode of the first photovoltaic cell and electrically connect the first photovoltaic cell to a second polarity electrode of the second photovoltaic cell, wherein the first wire electrically contacts a major portion of a surface of the first polarity electrode; and
at least one diode configured to bypass at least one cell of the plurality of photovoltaic cells,
wherein the first photovoltaic cell comprises an active portion and a shaded portion configured as a diode bypassing the second photovoltaic cell,
wherein the first photovoltaic cell comprises a second polarity electrode,
wherein the active portion of the first photovoltaic comprises a transparent first polarity electrode and a photovoltaic material disposed between the second polarity electrode and the transparent first polarity electrode,
wherein the shaded portion of the first photovoltaic cell comprises a shaded first polarity electrode and a semiconductor material disposed between the second polarity electrode and the shaded first polarity electrode,
wherein the transparent first polarity electrode is electrically insulated from the shaded first polarity electrode and the photovoltaic material of the active portion of the first photovoltaic cell is separated from the semiconductor material of the shaded portion of the first photovoltaic cell, and
wherein the shaded first polarity electrode of the shaded portion of the first photovoltaic cell is electrically connected to a second polarity electrode of the second photovoltaic cell and the second polarity electrode of the first photovoltaic cell is electrically connected to a first polarity electrode of the second photovoltaic cell.

* * * * *